(12) United States Patent
Wang

(10) Patent No.: US 7,157,730 B2
(45) Date of Patent: Jan. 2, 2007

(54) ANGLED WAFER ROTATING ION IMPLANTATION

(75) Inventor: Tzu-Yu Wang, Maple Grove, MN (US)

(73) Assignee: Finisar Corporation, Sunnyvale, CA (US)

( * ) Notice: Subject to any disclaimer, the term of this patent is extended or adjusted under 35 U.S.C. 154(b) by 59 days.

(21) Appl. No.: 10/323,889

(22) Filed: Dec. 20, 2002

(65) Prior Publication Data

US 2004/0121551 A1 Jun. 24, 2004

(51) Int. Cl.
*H01L 29/06* (2006.01)

(52) U.S. Cl. .................. 257/22; 372/50.11; 438/45; 438/514

(58) Field of Classification Search ................ 438/514, 438/519, 525–527, 521, 39, 45; 372/43–46, 372/50.11; 257/12, 13, 22, 84, 85
See application file for complete search history.

(56) References Cited

U.S. PATENT DOCUMENTS

| | | | | |
|---|---|---|---|---|
| 5,245,622 A | * | 9/1993 | Jewell et al. ................. | 372/45 |
| 5,328,854 A | * | 7/1994 | Vakhshoori et al. .......... | 438/22 |
| 5,637,511 A | * | 6/1997 | Kurihara ...................... | 438/79 |

* cited by examiner

*Primary Examiner*—David Vu
(74) *Attorney, Agent, or Firm*—Workman Nydegger

(57) ABSTRACT

Ion implantation by mounting a semiconductor wafer on a rotating plate that is tilted at an angle relative to an ion implantation flux. The tilt angle and the ion implantation energy are adjusted to produce a desired implantation profile. Ion implantation of mesa structures, either through the semiconductor wafer's surface or through the mesa structure's wall is possible. Angled ion implantation can reduce or eliminate ion damage to the lattice structure along an aperture region. This enables beneficial ion implantation profiles in vertical cavity semiconductor lasers. Mask materials, beneficially that can be lithographically formed, can selectively protect the wafer during implantation. Multiple ion implantations can be used to form novel structures.

8 Claims, 4 Drawing Sheets

ANGLED WAFER ROTATING ION IMPLANTATION

CROSS-REFERENCE TO RELATED APPLICATIONS

Not applicable.

UNITED STATES GOVERNMENT RIGHTS

Not Applicable.

BACKGROUND OF THE INVENTION

1. Field of the Invention

This invention relates to ion implantation of semiconductor devices. More particularly, this invention relates to ion implantation techniques that are suitable for ion implanting vertical cavity surface emitting lasers and that can result in novel implantation structures.

2. Discussion of the Related Art

Vertical cavity surface emitting lasers (VCSELs) represent a relatively new class of conductor lasers. While there are many variations of VCSELs, one common characteristic is that they emit light perpendicular to a wafer's surface. Advantageously, VCSELs can be formed from a wide range of material systems to produce specific characteristics. In particular, the various material systems can be tailored to emit different wavelengths, such as 1550 nm, 1310 nm, 850 nm, 670 nm, and so on.

VCSELs include semiconductor active regions, distributed Bragg reflector (DBR) mirrors, current confinement structures, substrates, and contacts. Because of their complicated structure, and because of their material requirements, VCSELs are usually grown using metal-organic chemical vapor deposition (MOCVD) or molecular beam epitaxy (MBE).

FIG. 1 illustrates a typical VCSEL 10. As shown, an n-doped gallium arsenide (GaAs) substrate 12 has an n-type electrical contact 14. An n-doped lower mirror stack 16 (a DBR) is on the substrate 12, and an n-type graded-index lower spacer 18 is disposed over the lower mirror stack 16. An active region 20, usually having a number of quantum wells, is formed over the lower spacer 18. A p-type graded-index top spacer 22 (another confinement layer) is disposed over the active region 20, and a p-type top mirror stack 24 (another DBR) is disposed over the top spacer 22. Over the top mirror stack 24 is a p-type conduction layer 9, a p-type GaAs cap layer 8, and a p-type electrical contact 26. Alternately, the top mirror and graded-index region can consist of a tunnel junction structure. This comprises a short p-doped region nearest the active region junction. Beyond the p-doped region is a tunnel junction followed by an n-type DBR.

Still referring to FIG. 1, the lower spacer 18 and the top spacer 22 separate the lower mirror stack 16 from the top mirror stack 24 such that an optical cavity is formed. As the optical cavity is resonate at specific wavelengths, the mirror separation is controlled so as to resonant at a predetermined wavelength (or at a multiple thereof). At least part of the top mirror stack 24 includes an insulating region 40 formed by implanting ions (protons or certain other elements such as deuterium, helium, iron, etc.) that provides current confinement. Protons can be implanted, for example, in accordance with the teachings of U.S. Pat. No. 5,115,442, which is incorporated by reference. Alternatively, the insulating region 40 can be formed using an oxide layer, for example, in accordance with the teachings of U.S. Pat. No. 5,903,588, which is incorporated by reference. However, the principles of the present invention relate to insulating via an ion implanting process. In either event, the insulating region 40 defines a conductive circular central opening 42 that forms an electrically conductive path through the insulating region 40.

In operation, an external bias causes an electrical current 21 to flow from the p-type (or n-type in the case of a tunnel junction device) electrical contact 26 toward the n-type electrical contact 14. The insulating region 40 and the conductive central opening 42 confine the current 21 such that it flows through the conductive central opening 42 to the active region 20. Some of the electrons in the current 21 are converted into photons in the active region 20. Those photons bounce back and forth (resonate) between the lower mirror stack 16 and the top mirror stack 24. The lower mirror stack 16 and the top mirror stack 24 are very high reflectivity mirrors, with the lower mirror being at least slightly higher reflectivity than the top mirror. Due to this difference, some photons emerge as coherent light 23, i.e., laser. Still referring to FIG. 1, the light 23 passes through the p-type conduction layer 9, through the p-type GaAs cap layer 8, through an aperture 30 in the p-type electrical contact 26, and out of the surface of the vertical cavity surface emitting laser 10. In the tunnel junction device format, the light follows the same path but through the tunnel junction layer and the n-type top mirror.

It should be understood that FIG. 1 illustrates a common VCSEL structure, and that numerous variations are possible. For example, the dopings can be changed (say, by providing a p-type substrate 12), different material systems can be used, operational details can be tuned for maximum performance, and additional structures, such as tunnel junctions (briefly described above), can be added.

In addition, it should be noted that multiple VCSELs can be formed on the same substrate, thus producing a VCSEL array. Ion implanting provides a method of electrically isolating individual VCSEL elements. To do so, ions with certain insulating interaction characteristics such as protons are implanted between the individual VCSEL elements to produce high-resistance zones that electrically isolate the VCSEL elements. Thus, by controlling ion implantation locations and energies, electrical confinement within a VCSEL and electrical isolation between adjacent VCSELs on the same substrate can be implemented.

Prior art ion implantation techniques usually direct ions perpendicularly or nearly perpendicular onto the surface of a wafer being implanted. While generally successful, such prior art implantation techniques are less than optimal in some applications. For example, perpendicular implantation is not suitable for laterally implanting large vertical aspect ratio mesa structures. Another limitation is the difficulty of implementing desired gain guide isolation steps. Finally, prior art ion implantation techniques induce substantial lattice damage in a device's aperture or electrical contact region. Such lattice damage can be highly detrimental to electrical or optical performance.

Because of the foregoing problems, a new ion implantation technique would be beneficial. Particularly beneficial would be an ion implantation technique that is suitable for use with devices having large vertical aspect ratio mesa structures. Also beneficial would be an ion implantation technique that avoids or reduces the problems related to obtaining required gain guide isolation steps. Also beneficial would be an ion implantation technique that reduces lattice damage in the aperture or electrical contact region near the aperture.

SUMMARY OF THE INVENTION

Accordingly, the principles of the present invention are directed to a new ion implantation technique. In particular, the principles of the present invention provide for angled ion implantation. Such angled ion implantation can be implemented using a tilted, rotating ion implantation plate that holds a device (substrate or sample) being implanted. The ion implantation plate can be tilted at an angle or angles relative to an ion flux while the device is rotated. This can achieve novel and useful ion implantations in various semiconductor devices, specifically including VCSELs.

According to the principles of the present invention, if a semiconductor device being ion implanted includes a mesa structure, ion implantation can be performed below the mesa structure and/or through the mesa structure. In either event, ion damage to the lattice along the aperture region of the device can be reduced.

Ion implanting a flat semiconductor wafer according to the principles of the present invention includes coating the semiconductor wafer with a mask material that shields selected areas of the semiconductor wafer from implanting ions. The mask material is then lithographically exposed and developed. The lithographically masked semiconductor wafer is then placed inside an ion implant chamber on a tilted rotation plate. The tilted rotation plate is then rotated during ion implantation to produce an angled ion implant into the semiconductor wafer. Multiple ion implantations can be performed as desired. Ion implanting a semiconductor wafer having a mesa structure according to an aspect of the present invention includes coating the semiconductor wafer with a planarizable material, such as BCB, polyimide, photo-resist, or spin-on glass. Such planarization is beneficially performed such that the planarizable material becomes level with the mesa. The planarizable material and exposed semiconductor surface is then coated with a mask material that blocks implanting ions. The mask material is then patterned, beneficially by lithographic exposure and development. Then, the planarizable material is removed to expose the sidewalls of the mesa structure and part of the semiconductor wafer. Then, the semiconductor wafer is placed in an ion implant chamber on a tilted rotation plate. The rotation plate is then rotated during ion implantation to produce an angled ion implant into the semiconductor wafer. Multiple ion implantations can be performed as desired, as ion implantation typically involves multiple implant energies (1 to 5 energy levels are typical) and predetermined dose amounts at each energy level. For example, an ion implantation could involve the following sequence:

$1^{st}$ dose: 5E15 ions/cm$^2$ at 35 keV $2^{nd}$ dose: 5E15 ions/cm$^2$ at 70 keV, etc..

Finally, the mask material and any residual planarization material is removed.

Additional features and advantages of the invention will be set forth in the description that follows, and in part will be apparent from that description, or may be learned by practice of the invention.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

Figure 1:
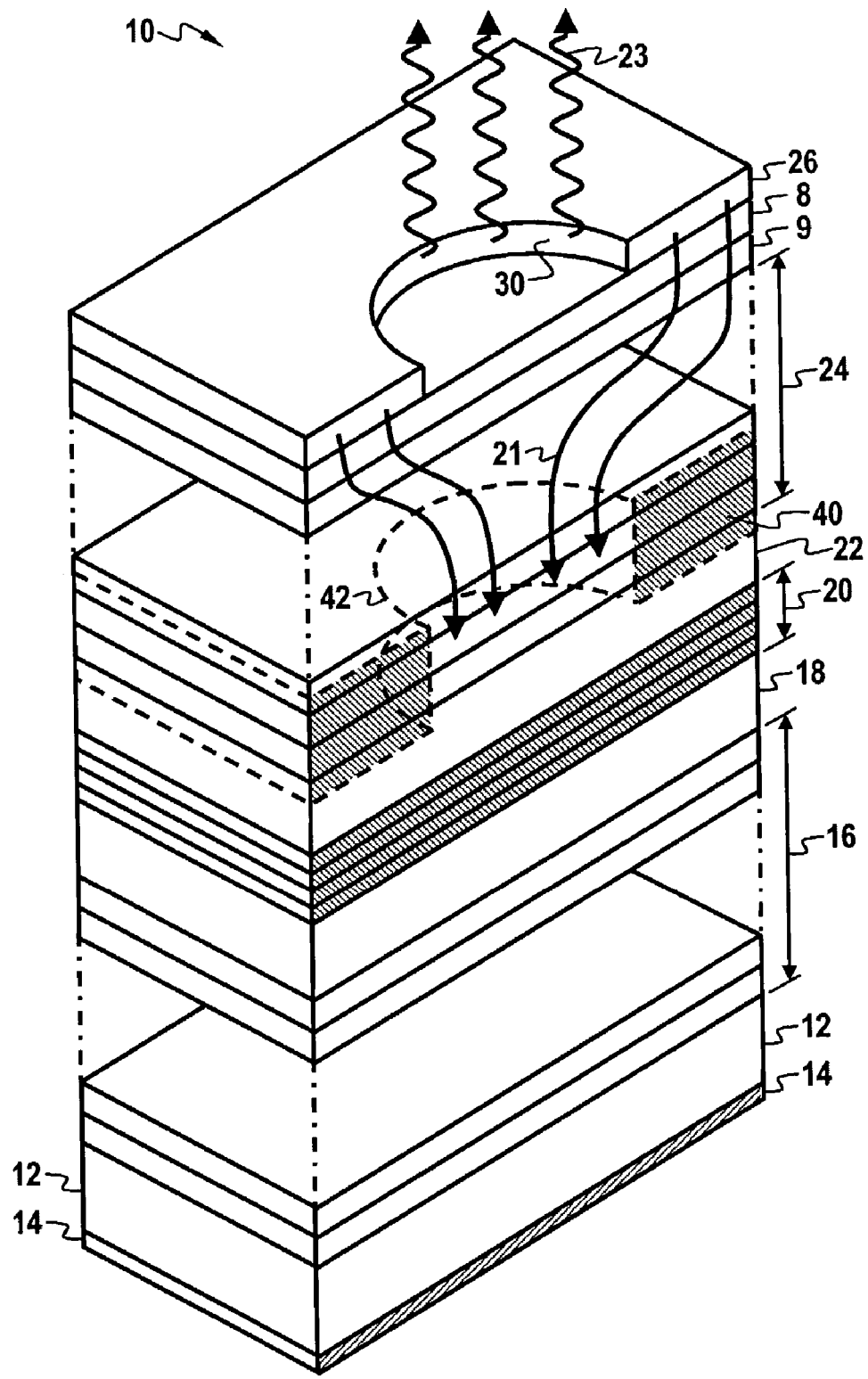
FIG. 1 illustrates a typical vertical cavity surface-emitting laser.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENT

The principles of the present invention provide for ion implantation of a semiconductor wafer by mounting the semiconductor wafer on a rotating plate that is tilted at an angle relative to an oncoming ion implantation flux. The rotation angle or angles and the implantation energy can be controlled to produce desired implantation profiles and depths. Furthermore, one or more implantation masks can be used to provide specific tailoring schemes. Additionally, if the semiconductor wafer being implanted has a mesa structure, ion implantation can occur either through the semiconductor wafer below the mesa or through the mesa's wall.

Figure 2:
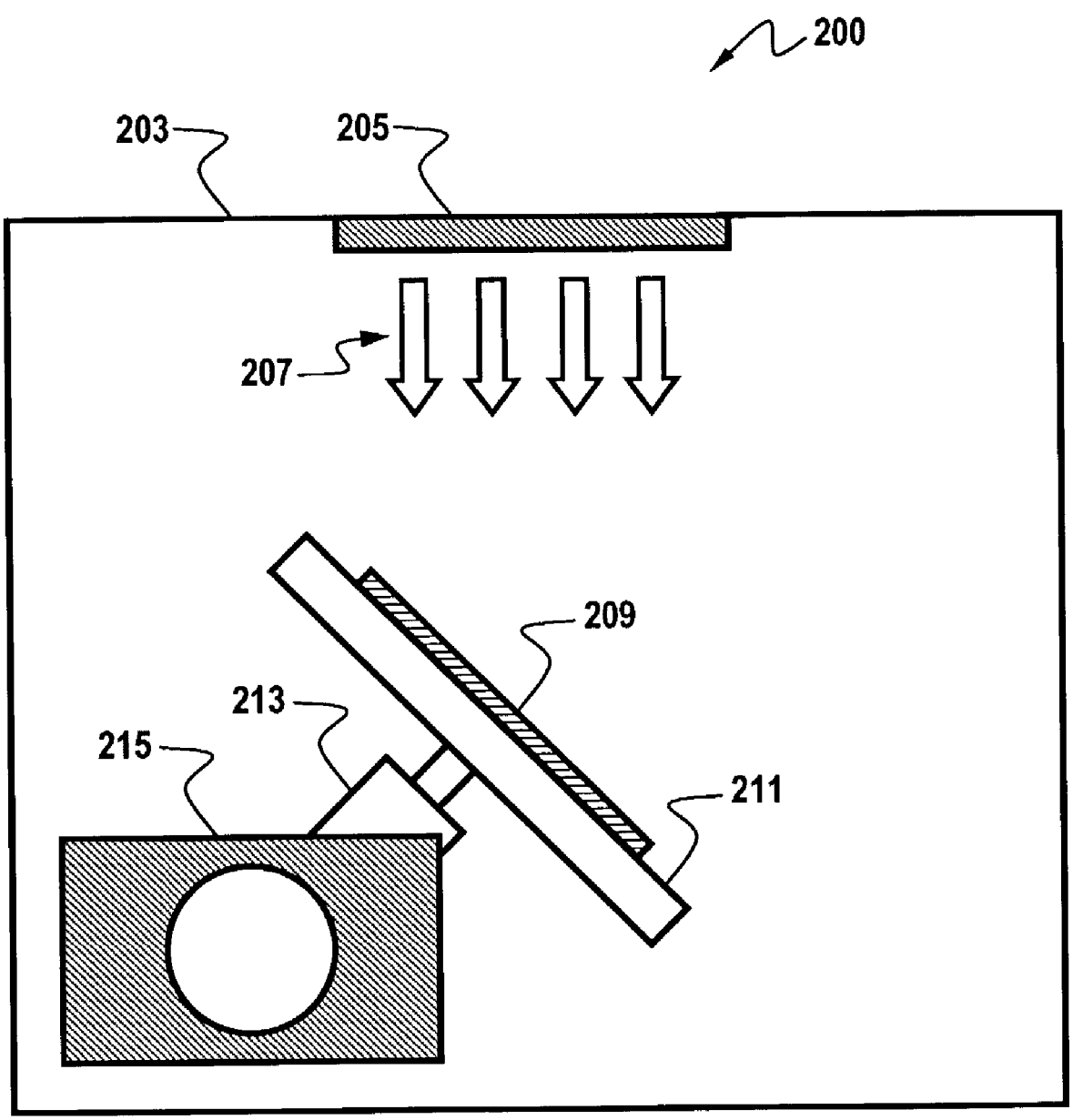
FIG. 2 illustrates ion implantation of a vertical cavity surface emitting laser wafer according to the principles of the present invention.

An apparatus 200 for ion implanting a semiconductor wafer, specifically a VCSEL wafer 209, is illustrated in FIG. 2. As shown, the VCSEL wafer 209 is mounted on a rotating plate 211. The rotating plate 211 is set at a desired angle relative to an ion implantation flux 207 from an ion source 205. The angle of the rotating plate 211 is fixed by a tilt mechanism 215. A motor 213 provides rotational force for the rotating plate 211. As shown in FIG. 2, the ion source 205, the tilt mechanism 215, the rotating plate 211, the motor 213, and the VCSEL wafer 209 are all located in an ion chamber 203 during ion implantation.

In operation, the VCSEL wafer 209, which may similar to those that are subsequently described, is mounted on the rotating plate 211. That plate is set at the desired angle by the mechanism 215. The motor 213 then rotates the rotating plate 211, beneficially at a constant, pre-determined rotational velocity. The ion source 205 then emits the ion flux 207 onto the VCSEL wafer 209 such that ion implantation occurs. It should be understood that the ion implantation energy, dose, and the tilt angle can be controlled to produce a desired implantation profile. It should be further understood that control of the incident ion flux angle is preferentially controlled by adjusting the angle of the plate that holds the sample. However, it is also possible to control the incident flux angle by either controlling the ion source or controlling the ion beam. The ion beam can be directed by use of magnets.

While the foregoing has described ion implanting a VCSEL wafer 209, in practice, other types of semiconductor wafers can also benefit from angled ion implantation. However, because VCSELs can have ion implantation-induced apertures, and because such apertures can benefit from the principles of the present invention, various ion implantation schemes into VCSEL structures will be provided. However, it should be understood that other ion implantation schemes in VCSELs are possible.

Figure 3:
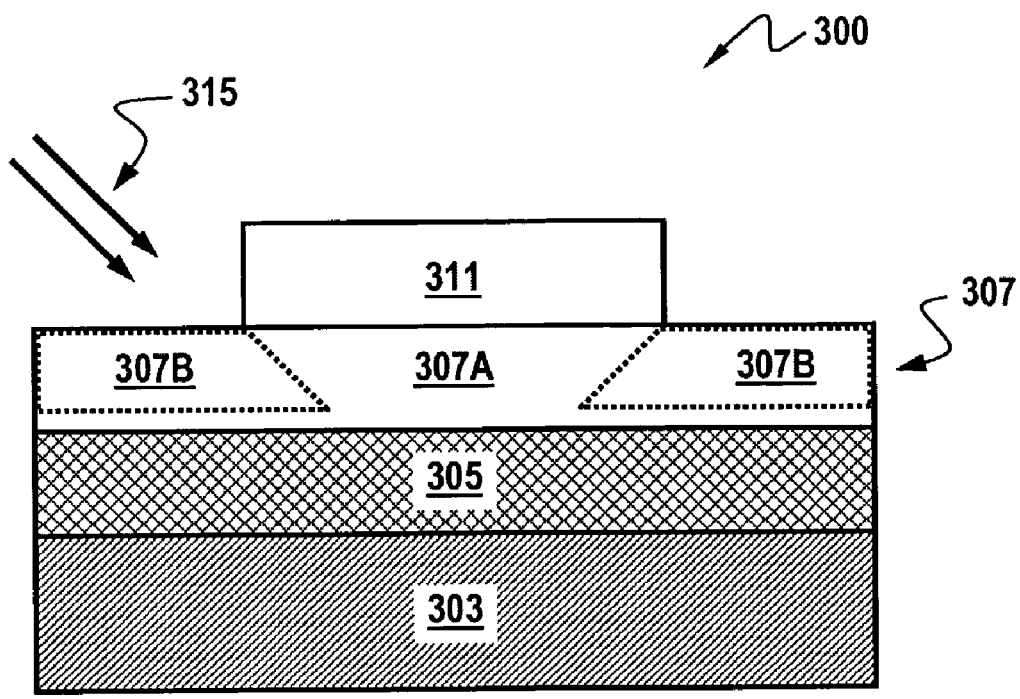
FIG. 3 illustrates an ion implantation profile of a VCSEL wafer after implantation using an implant mask.

FIG. 3 illustrates a planar VCSEL structure 300 having an implantation mask 311. The implantation mask 311 is beneficially formed lithographically. First, a masking of an ion-flux resistant material is formed on the surface of the VCSEL wafer. Then, the mask is patterned lithographically, exposed, and developed.

Referring now to both FIGS. 2 and 3, with the implantation mask 311 in place, the VCSEL wafer 209 (in FIG. 2, 300 in FIG. 3) is placed in the ion chamber 203 on the rotating plate 211. The tilt mechanism 215 is adjusted to set the desired angle between the rotating plate 21 land the implantation flux 207. The motor 213 is turned on and then ions 315 (see FIG. 3) are implanted into VCSEL wafer 300.

Turning back to FIG. 3, the VCSEL wafer 300 is comprised of an upper device layer 307 (which may include a top DBR 24 as shown in FIG. 1), a lower device layer 305 (which may include an active layer 20 as shown in FIG. 1), and a substrate layer 303 (which may include a substrate 12 as shown in FIG. 1). The oncoming ions implant into the VCSEL 300 to form an implant region 307B. As shown, the implantation mask 311 causes the implant region 307B to have a pointed, wedge-shape cross-section. This is beneficial because the lattice damage in the aperture 307A (the area between the wedge points in FIG. 3) of the upper device layer 307 consequently suffers only minimal ion implant damage. This is highly advantageous as the current guide nature of the aperture is enhanced, which improves performance, while the electrical contact and optical aperture are protected. Thus, the aperture 307A of the VCSEL can be tailored by controlling the size of the implantation mask 311, the angle between the surface of the VCSEL wafer 300 and the incoming ions 315, and the implantation energy of the incoming ions 315.

Figure 4:
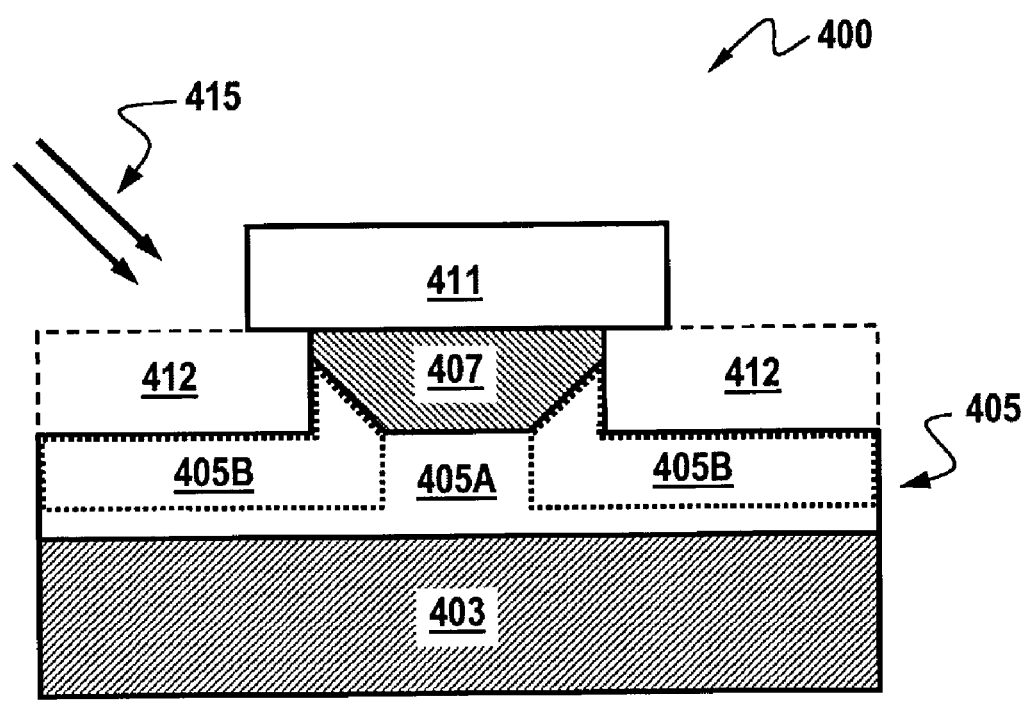
FIG. 4 illustrates an ion implantation profile of a mesa-structured VCSEL wafer after implantation using an implant mask.

The principles of the present invention are also applicable to mesa-structured wafers. For example, FIG. 4 illustrates a mesa-structured VCSEL wafer 400 having an implantation mask 411. The implantation mask 411 is beneficially formed lithographically. First, a planarizing material 412 (shown in dotted lines because FIG. 4 illustrates the VCSEL wafer 400 after the planarizing material 412 has been removed) such as BCB, polyimide, photo resist, or spin-on glass, is coated over the VCSEL wafer 400 up to the top of the mesa-structure 407. Then, the VCSEL wafer 400 is coated with a mask material comprised of an ion-flux resistant material. Then, the mask material is lithographically patterned, exposed, and developed to produce the implantation mask 411. Then, the planarizing material 412 is removed. As shown, it can be beneficial for the implantation mask 411 to extend over the mesa structure 407.

Referring now to both FIGS. 2 and 4, with the implantation mask 411 in place, the VCSEL wafer 400 is placed in the chamber 203 on the tilt mechanism 215. The tilt mechanism 215 is then adjusted such that the desired angle between the rotating plate 211 and the ion flux 207 is achieved. The motor 213 is then turned on while ions 415 (see FIG. 4) are implanted at the desired angle toward the VCSEL wafer 400.

Turning back to FIG. 4, the VCSEL wafer 400 is comprised of a mesa upper device layer 407 (which may include a top DBR 24 as shown in FIG. 1), a lower device layer 405 (which may include an active layer 20 as shown in FIG. 1), and a substrate layer 403 (which may include a substrate 12 as shown in FIG. 1). The incoming ions implant into the VCSEL 400 to form an isolation region 405B that extends from the lower layer 405 into part of the upper layer 407. The non-implanted region 405A of the lower device layer 405, and the shaded area of the mesa upper device layer 407 include an aperture. That aperture can be tailored by controlling the dimensions of the implantation mask, the size, height, and material composition of the mesa-structure 407, the angle between the surface of the VCSEL structure 400 and the dose of the incoming ions 415, and the energy of the incoming ions 415.

Figure 5:
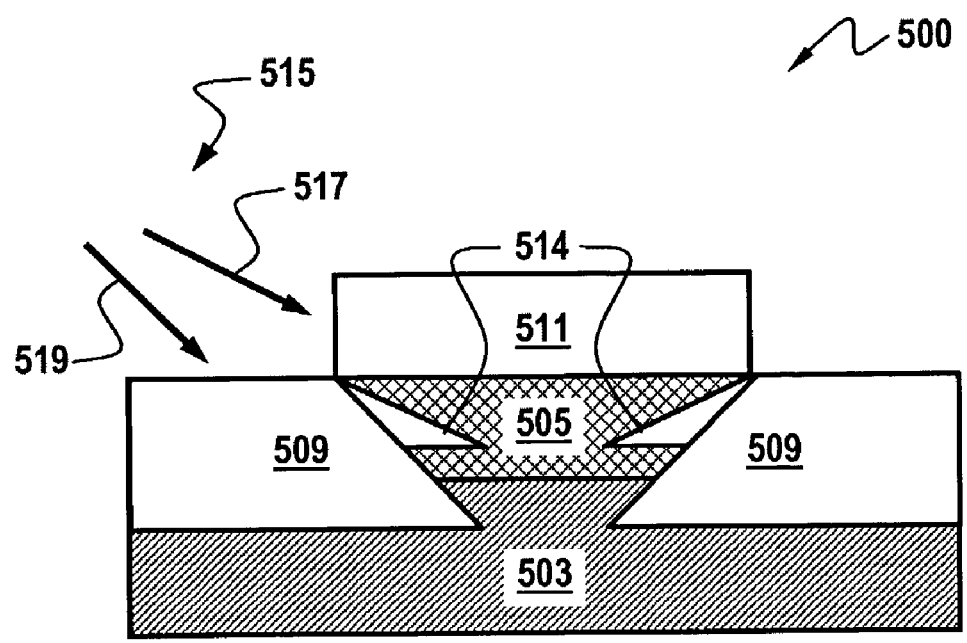
FIG. 5 illustrates an ion implantation profile of a VCSEL wafer after implantation using an implant mask and multiple energy ion implantation beams that are directed at different angles.

The foregoing has described ion implantations of both planar and mesa-structured semiconductor wafers (specifically VCSELs) using only a single ion irradiation. However, the principles of the present invention include multiple ion irradiations. For example, FIG. 5 illustrates multiple ion irradiations of a planar VCSEL structure 500. As shown, the VCSEL structure 500 includes an implantation mask 511 that is beneficially formed lithographically. The VCSEL structure 500 further includes at least an upper layer 505 (which may include a top DBR 24 as shown in FIG. 1) and a lower layer 503 (which may include an active layer 20 and a substrate 12 as shown in FIG. 1).

Referring now to both FIGS. 2 and 5, with the implantation mask 511 in place, the VCSEL structure 500 is placed into the ion chamber 203 on the rotating plate 211. The tilt mechanism 215 is then adjusted to fix the rotating plate 211 at a desired first angle relative to the oncoming ion flux 207 (which is used for the ions 517 and 519 in FIG. 5), which is controlled to have a desired first ion implantation energy. The motor 213 is then turned on and the ions 517 are directed toward the VCSEL structure 500 (see FIG. 5). The result is an implant region 514 having a pointed, wedge-shaped implant cross-section.

Still referring to both FIGS. 2 and 5, after the implant region 514 is formed, the tilt mechanism 215 is adjusted to set the rotating plate 111 at a second angle relative to the ion flux 207, which is now controlled to have a desired second ion implantation energy (which is greater than the first ion implantation energy). The motor 213 is turned on and ions 519 are directed toward the VCSEL structure 500 (see FIG. 5). The result is an implant region 509 having a pointed, wedge-shaped implant cross-section. As shown the VCSEL structure 500 then has two implant regions, both of which are wedge shaped.

Figure 6:
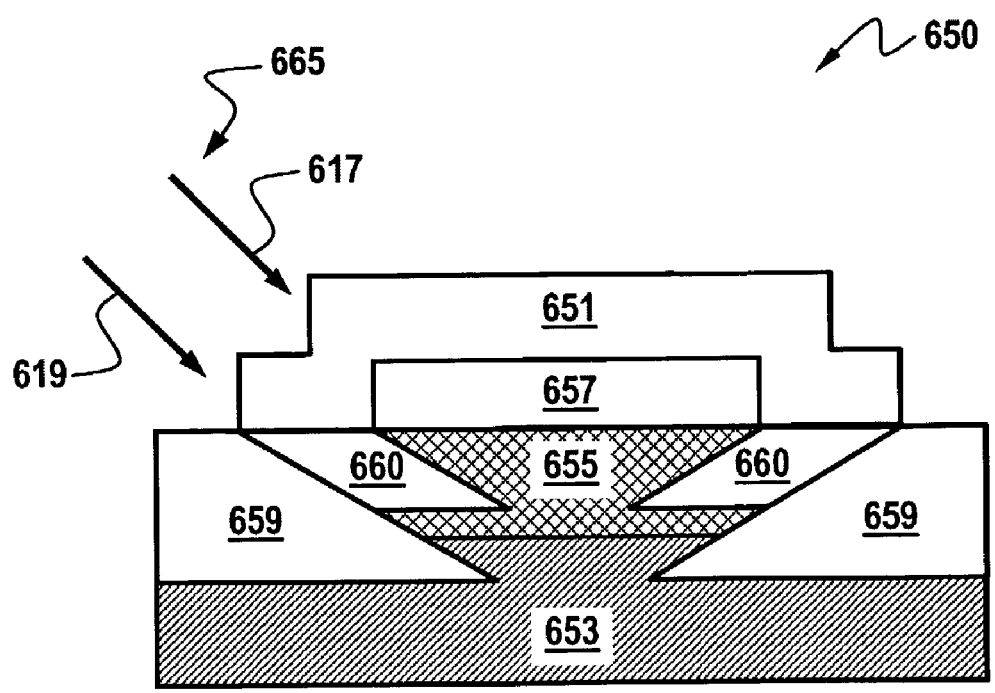
FIG. 6 illustrates an ion implantation profile of a VCSEL wafer after implantation using multiple implant masks and multiple energy ion implantation beams.

While FIG. 5 shows one method of obtaining multiple wedge-shaped implant regions, the principles of the present invention are broad enough to provide for another method for obtaining such implant regions. For example, FIG. 6 illustrates the result of multiple ion irradiations of a planar VCSEL structure 650. As shown, the VCSEL structure 650 uses two implantation masks, a top implantation mask 651 and a lower implantation mask 657. The implantation masks are located on a VCSEL wafer that is comprised of at least an upper layer 655 (which may include a top DBR 24 as shown in FIG. 1) and of a lower layer 653 (which may include an active layer 20 and a substrate 12 as shown in FIG. 1). The implantation masks 651 and 657 are beneficially formed lithographically.

Referring now to both FIGS. 2 and 6, with the implantation masks 651 and 657 in place, the VCSEL structure 650 is placed in the ion chamber 203 on the rotating plate 211. The tilt mechanism 215 is then adjusted to fix the rotating plate 211 at a pre-determined angle relative to the ion flux 207, which is controlled to have a predetermined first ion implantation energy. The motor 213 is turned on and ions 619 are directed toward the VCSEL structure 650 (see FIG. 6). The result is a first implant region 659 having a pointed, wedge-shaped implant cross-section.

Still referring to both FIGS. 2 and 6, after the implant region 659 is formed, the VCSEL structure 650 is removed from the rotating plate 211 and the top implantation mask 651 is removed. The VCSEL structure 650 is then returned to the rotating plate 211 and then ions 617 are directed toward the VCSEL structure 650. The result is a second implant region 660 having a pointed, wedge-shaped implant cross-section.

As previously noted, the principles of the present invention are highly useful. For example, those principles enable implantation of large vertical aspect ratio mesa structures. Additionally, it is possible to provide an angled current confinement region that is defined by isolation steps. Additionally, lattice damage in a device's aperture and electrical contact area caused by ion implantation can be reduced.

The embodiments and examples set forth herein are presented to explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. An ion-implanted semiconductor device comprising:
   a substrate layer;
   a first layer formed over the substrate layer, the first layer including an active layer;
   a mesa structure formed over the first layer, at least a portion of the mesa structure having a substantially rectangular crosssectional profile; and
   an ion implantation region formed in both a portion of the mesa structure and a portion of the first layer, wherein the ion implantation region extends into the portion of the mesa having a substantially rectangular cross-sectional profile.

2. An ion-implanted semiconductor device according to claim 1, wherein the ion-doped semiconductor device is a vertical cavity surface emitting laser and the mesa structure includes a distributed Bragg reflector.

3. An ion-implanted semiconductor device according to claim 1, wherein the mesa structure further comprises an aperture defined in part by the ion implantation region and wherein the ion implantation region fanned in the portion of the mesa structure has a wedge-shaped ion-doping cross-sectional profile.

4. Art ion-implanted semiconductor device comprising:
   a substrate layer;
   a lower layer formed over the substrate layer, the lower layer including an active layer;
   an upper layer formed over the lower layer; and
   a first ion implantation region and a second inn implantation region, at least a portion of each ion implantation region being defined in the upper layer and/or the lower layer, a non-overlapping portion of the first ion implantation region formed vertically to a non-overlapping portion of the second ion implantation region and the first and second ion implantation regions defining a current confinement region, each of the first and second ion implantation regions having a substantially wedge-shaped ion-doping cross-sectional profile, the first ion implantation region associated with a first ion implantation energy and the second ion implantation region associated with a second ion implantation energy.

5. An ion-implanted semiconductor device according to claim 4, wherein the ion-doped semiconductor device is a vertical cavity surface emitting laser and the upper layer includes a distributed Bragg reflector.

6. An ion-doped semiconductor device according to claim 5, wherein the upper layer includes a mesa structure, at least a portion of the mesa structure included in one of the plurality of ion implantation regions.

7. An ion-implanted semiconductor device according to claim 4, in which at least a portion of each ion implantation region is defined in the upper layer.

8. An ion-implanted semiconductor device according to claim 4, in which at least one of the wedge shaped profiles farms a point with an acute angle.

* * * * *

UNITED STATES PATENT AND TRADEMARK OFFICE
CERTIFICATE OF CORRECTION

PATENT NO. : 7,157,730 B2 Page 1 of 1
APPLICATION NO. : 10/323889
DATED : January 2, 2007
INVENTOR(S) : Tzu-Yu Wang It is certified that error appears in the above-identified patent and that said Letters Patent is hereby corrected as shown below:

Column 1
Line 58, change "resonate" to --resonated--
Line 59, change "resonant" to --resonate--

Column 4
Line 55, change "may similar" to --may be similar--

Column 5
Line 23, change "21" to --211--

Column 6
Line 45, change "111" to --211--

Column 7
Line 52, change "crosssectional" to --cross-sectional--

Column 8
Line 23, change "inn" to --ion--
Line 50, change "farms" to --forms--

Signed and Sealed this

Twenty-third Day of September, 2008

JON W. DUDAS
*Director of the United States Patent and Trademark Office*